United States Patent
Terasaka

(10) Patent No.: US 10,240,233 B2
(45) Date of Patent: Mar. 26, 2019

(54) HEATING VAPORIZATION SYSTEM AND HEATING VAPORIZATION METHOD

(71) Applicant: HORIBA STEC, Co., Ltd., Kyoto-shi, Kyoto (JP)

(72) Inventor: Masanori Terasaka, Kyoto (JP)

(73) Assignee: HORIBA STEC, Co., Ltd., Kyoto-shi, Kyoto (JP)

( * ) Notice: Subject to any disclaimer, the term of this patent is extended or adjusted under 35 U.S.C. 154(b) by 282 days.

(21) Appl. No.: 14/290,864

(22) Filed: May 29, 2014

(65) Prior Publication Data

US 2014/0356796 A1 Dec. 4, 2014

(30) Foreign Application Priority Data

May 30, 2013 (JP) .................................. 2013-114635

(51) Int. Cl.
*C23C 16/448* (2006.01)
*B01D 1/00* (2006.01)
*F27D 19/00* (2006.01)

(52) U.S. Cl.
CPC ........ *C23C 16/4485* (2013.01); *B01D 1/0082* (2013.01); *F17C 2270/0518* (2013.01); *F27D 2019/0028* (2013.01)

(58) Field of Classification Search
CPC ............... B01D 1/0082; C23C 16/4485; F17C 2270/0518; F27D 2019/0028
USPC ......................................... 432/13, 24, 26, 45
See application file for complete search history.

(56) References Cited

U.S. PATENT DOCUMENTS

| 4,582,480 A | * | 4/1986 | Lynch | B01D 1/0082 261/121.1 |
| 2003/0111014 A1 | * | 6/2003 | Donatucci | C23C 16/4485 118/726 |
| 2004/0123657 A1 | * | 7/2004 | Kim | G01F 1/6847 73/204.21 |
| 2008/0011741 A1 | * | 1/2008 | Hamaguchi | H05B 6/36 219/642 |

(Continued)

FOREIGN PATENT DOCUMENTS

| JP | 07230941 | * | 8/1995 |
| JP | 07230941 A | | 8/1995 |
| JP | 2001156055 A | | 6/2001 |

(Continued)

OTHER PUBLICATIONS

Japanese Patent Office, Office Action of Japanese Patent Application No. 2013-114635, dated Feb. 20, 2014, 4 pages.

Primary Examiner — Steven B McAllister
Assistant Examiner — Benjamin W Johnson
(74) Attorney, Agent, or Firm — Alleman Hall Creasman & Tuttle LLP

(57) ABSTRACT

A heating vaporization system provided with: a container that heats and vaporizes a source to produce source gas; a pipe for leading out the source gas; a sensor flow path that is provided in the pipe; a flow rate detecting part that is provided with a thermal type flow rate sensor provided in the sensor flow path, and measures a flow rate of the source gas flowing through the pipe; a flow rate regulating part that regulates the flow rate of the source gas flowing through the pipe located upstream of the flow rate detecting part; and a control part that uses a result of the detection by the flow rate detecting part to control the flow rate regulating part.

8 Claims, 4 Drawing Sheets

(56) References Cited

U.S. PATENT DOCUMENTS

2009/0232986 A1* 9/2009 Choi ................... C23C 16/4481
427/255.28

FOREIGN PATENT DOCUMENTS

| JP | 2003273026 A | | 9/2003 |
|----|--------------|---|--------|
| JP | 2004263230 A | * | 9/2004 |
| JP | 2013055303 A | | 3/2013 |

* cited by examiner

HEATING VAPORIZATION SYSTEM AND HEATING VAPORIZATION METHOD

TECHNICAL FIELD

The present invention relates to a heating vaporization system and heating vaporization method that heat and vaporize a source (material) used in fields such as semiconductor manufacturing.

BACKGROUND ART

One such heating vaporization system and one such heating vaporization method are described in, for example, Patent Literature 1.

The heating vaporization system and heating vaporization method described in Patent Literature 1 are provided with: a source tank that contains a liquid source, and also heats and vaporizes the liquid source to produce source gas (vaporized source); a gas lead-out pipe that leads out the source gas produced in the source tank; a gas flowmeter that measures a flow rate of the source gas flowing through the gas lead-out pipe; and a gas flow rate regulating valve that is arranged downstream of the gas flowmeter to regulate the flow rate of the source gas flowing through the gas lead-out pipe.

CITATION LIST

Patent Literature

Patent Literature 1: JP-A-2003-273026

SUMMARY OF INVENTION

Technical Problem

However, in the conventional heating vaporization system as described in Patent Literature 1, a problem occurs that in the case of opening/closing the gas flow rate regulating valve to regulate the flow rate of the source gas, pressure loss occurs, making a pressure upstream of the gas flow rate regulating valve higher than a pressure downstream of the gas flow rate regulating valve, and thereby the source gas flowing upstream of the gas flow rate regulating valve is brought into a liquid state from a gas state and easily condensed.

To solve such a problem, there is a possible method that, to prevent the condensation of the source gas in anticipation of the pressure loss caused by the gas flow rate regulating valve, increases temperatures of the source tank, gas lead-out pipe, gas flowmeter, and gas flow rate regulating valve. However, in the case of using the gas flowmeter of a thermal type that uses specific heat of the source gas to measure the flow rate, increasing the temperatures of the source gas and the gas flowmeter requires increasing a temperature of a sensor incorporated in the gas flowmeter more than necessary. As a result, the temperature of the sensor of the gas flowmeter exceeds a heat resistance temperature range where the measurement by the sensor is possible, which gives rise to a problem of being unable to accurately measure the flow rate. Further, there is also another problem that an electronic circuit, a sensor, and/or the like incorporated in the gas flowmeter are deteriorated, thereby shortening the life of the gas flowmeter itself.

In addition, increasing the temperatures of the gas flowmeter and the gas flow rate regulating valve also increases the temperature of the source gas flowing through the gas lead-out pipe, which may also give rise to a problem that the source gas is pyrolyzed and consequently deteriorated.

The present invention is made in consideration of the above problems, and a main desired object thereof is to provide a heating vaporization system and heating vaporization method that prevent the failures occurring in the gas flowmeter and source gas as well as preventing the condensation inside the gas lead-out pipe.

Solution to Problem

The heating vaporization system of the present invention is provided with: a container that contains a source, and heats and vaporizes the source to produce source gas; a pipe that is connected to the container to lead out the source gas produced in the container; a sensor flow path that is provided in the pipe; a flow rate detecting part that is provided with a thermal type flow rate sensor provided in the sensor flow path, and measures a flow rate of the source gas flowing through the pipe: a flow rate regulating part that is provided upstream of the flow rate detecting part to regulate the flow rate of the source gas flowing through the pipe; and a control part that uses a result of the measurement by the flow rate detecting part to control the flow rate regulating part.

In such a configuration, the flow rate detecting part is provided on the downstream side of the flow rate regulating part, and therefore in the case of increasing temperature of the flow rate regulating part in consideration of pressure loss, it is not necessary to make temperature of the flow rate detecting part equal to or higher than the temperature of the flow rate regulating part. For this reason, adverse effects such as the deterioration of the flow rate detecting part and the deterioration of the source gas due to increasing the temperature of the flow rate detecting part can be prevented, and also condensation inside the pipe due to pressure loss caused by the flow rate regulating part can be prevented to stably supply the source gas to a semiconductor process chamber or the like.

In addition, a flow rate control device of the present invention is provided with: a connecting part that is connected to a container that heats and vaporizes a contained source to produce source gas, and connected to a pipe through which the source gas produced in the container flows; a sensor flow path that is provided in the pipe; a flow rate detecting part that is provided with a thermal type flow rate sensor provided in the sensor flow path, and measures a flow rate of the source gas flowing through the pipe; a flow rate regulating part that is provided upstream of the flow rate detecting part to regulate the flow rate of the source gas flowing through the pipe; and a control part that uses a result of the measurement by the flow rate detecting part to control the flow rate regulating part.

Also, by in at least one of the flow rate detecting part and the flow rate regulating part, further providing heating means adapted to heat the source gas flowing through the pipe, the temperature of the flow rate regulating part can be preliminarily increased so as to prevent the occurrence of condensation, and the temperature of the flow rate detecting part can be kept at a temperature at which the source gas can be prevented from being liquefied again, so that the occurrence of condensation inside the pipe can be surely prevented.

Also, by further providing internal heating means that is arranged inside the pipe located on an upstream side or a downstream side of the flow rate regulating part, and adapted to heat the source gas, as compared with the case where heating means is arranged outside the pipe, heat of the heating means can be efficiently transferred to the source gas. For this reason, the source gas can be uniformly heated to prevent a reduction in detection accuracy of the flow rate detecting part due to uneven heating.

Advantageous Effects of Invention

According to the heating vaporization system and heating vaporization method of the present invention configured as described, failures occurring in a gas flowmeter and source gas can be prevented, and also condensation in a gas lead-out pipe can be prevented.

DESCRIPTION OF EMBODIMENTS

First Embodiment

A heating vaporization system 1 according to a first embodiment of the present invention is described below with reference to drawings.

Figure 1:
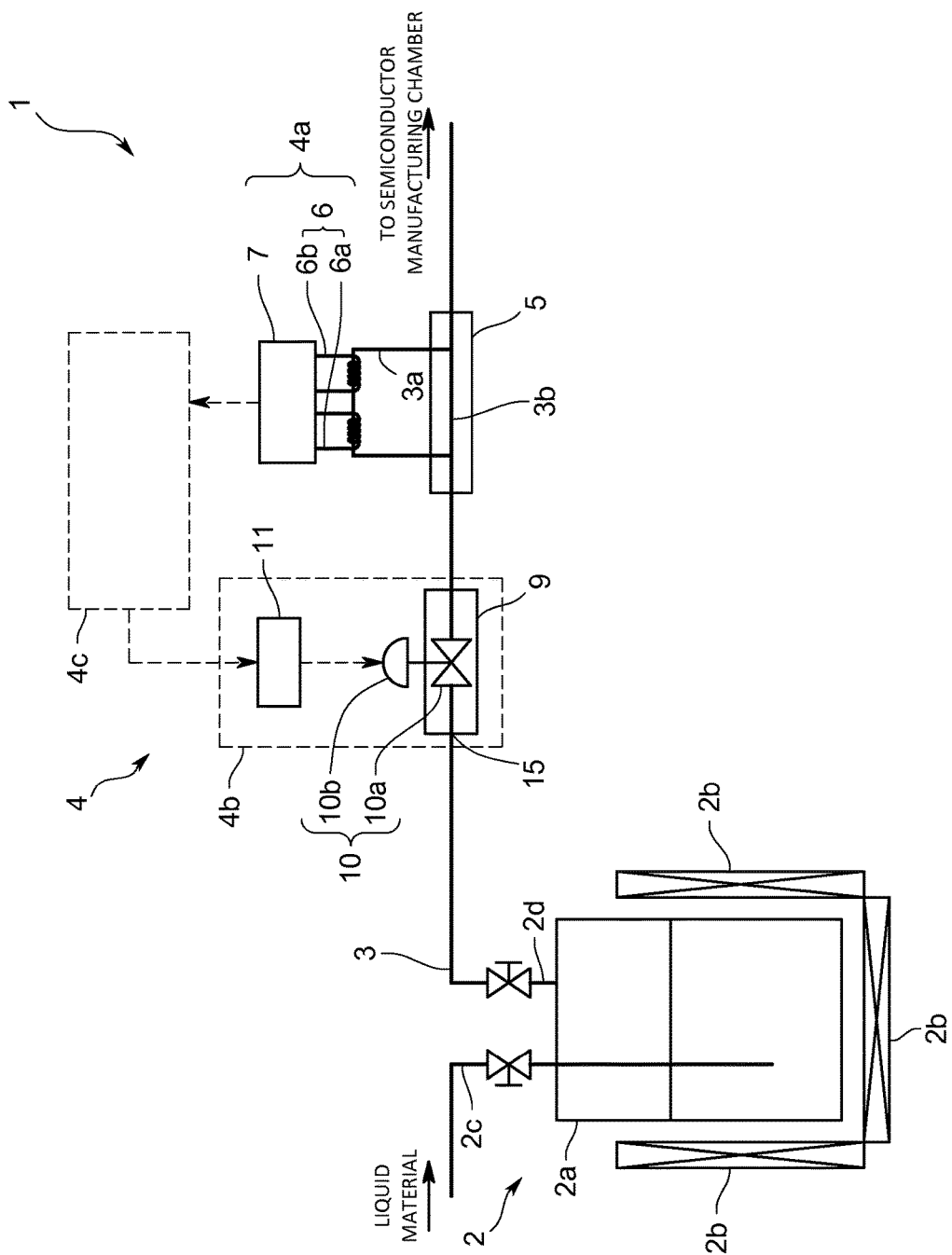
FIG. 1 is a schematic diagram illustrating a heating vaporization system in a first embodiment.

The heating vaporization system 1 of the first embodiment is intended to heat and vaporize a liquid source used in fields such as semiconductor manufacturing to produce source gas, and supply the source gas to a semiconductor process chamber or the like. Also, the heating vaporization system 1 is, as illustrated in FIG. 1, provided with: a container 2 that contains the liquid source, and also heats and vaporizes the liquid source to produce the source gas; a pipe 3 that is intended to supply the source gas produced in the container 2 to the semiconductor process chamber or the like; and a flow rate control device 4 that controls a flow rate of the source gas flowing through the pipe 3.

The container 2 has: a hollow tank 2a that contains the liquid source; a heating device 2b that heats the tank 2a; an introduction pipe 2c that is provided so as to penetrate through an upper wall of the tank 2a; and a lead-out pipe 2d that is protruded from the upper wall of the tank 2a.

The heating device 2b is, for example, a heater or the like, and arranged so as to surround an outer circumferential lateral surface and a bottom surface of the tank 2a. In the tank 2a heated by the heating device 2b, the liquid source reaches saturated vapor pressure and vaporizes, and consequently the source gas is produced.

The introduction pipe 2c is intended to supply the liquid source to the tank 2a, and of which a lower end is extended close to the bottom surface of the tank 2a.

The lead-out pipe 2d communicatively connects to an internal space of the tank 2a, and configured to lead the source gas produced in the tank 2a out of the tank 2a therethrough.

In addition, the introduction pipe 2c and the lead-out pipe 2d are respectively provided with valves for regulating flow rates of the fluids flowing through the pipes.

One end on an upstream side of the pipe 3 is connected to the lead-out pipe 2d and the other end on a downstream side of the pipe 3 is connected to the semiconductor process chamber or the like. Also, the source gas led out of the tank 2a through the lead-out pipe 2d passes through the pipe 3 and is supplied to the semiconductor process chamber or the like.

Further, part of the pipe 3 is provided with a substantially U-shaped sensor pipe 3a that branches from the pipe 3 and meets the pipe 3 again. The sensor pipe 3a serves as a sensor flow path for regulating the flow rate of the source gas flowing through the pipe 3. Also, a pipe diameter of the sensor pipe 3a is sufficiently small as compared with a pipe diameter of the pipe 3.

Also, from a branching point at which the sensor pipe 3a branches from the pipe 3 to a meeting point at which the sensor pipe 3a meets the pipe 3, the pipe 3 serves as a bypass flow path 3b, and the bypass flow path 3b is arranged with an unillustrated bypass formed by stacking flat plates in which holes are respectively provided by etching. Pressure loss occurring in the source gas passing through the bypass is the same as pressure loss occurring in the source gas passing through the sensor pipe 3a.

Further, a first block body 5 is provided so as to surround the pipe 3 provided with the bypass flow path 3b. The first block body 5 is made of metal having a substantially rectangular parallelepiped shape and excellent thermal conductivity, and inside the first block body 5, a through-hole for arranging a pipe provided as the bypass flow path 3b is provided.

The flow rate control device 4 is provided with: a flow rate detecting part 4a that measures the flow rate of the source gas flowing through the pipe 3; a flow rate regulating part 4b that regulates the flow rate of the source gas flowing through the pipe 3; and a control part 4c that uses a result of the detection by the flow rate detecting part 4a to control the flow rate regulating part 4b.

The flow rate detecting part 4a has: a thermal type flow rate sensor 6 that heats at least part of the sensor pipe 3a as well as sensing physical quantities related to temperature; and a flow rate calculation part 7 that, upon receipt of sensing signals sensed by the thermal type flow rate sensor 6, calculates the flow rate of the source gas flowing through the pipe 3.

The thermal type flow rate sensor 6 heats the sensor pipe 3a to sense the physical quantities (such as currents, voltages, or resistances) related to temperatures on upstream and downstream sides of the sensor pipe 3a. Specifically, the thermal type flow rate sensor 6 uses thermosensitive resistors of each of which an electrical resistance value increases or decreases along with a change in temperature, and is provided with: an upstream side sensor 6a that is coiled around the upstream side of the sensor pipe 3a; and a downstream side sensor 6b that is coiled around the downstream side of the sensor pipe 3a. Further, the thermal type flow rate sensor 6 heats the sensor pipe 3a in such a way that currents flow through the upstream side sensor 6a and the downstream side sensor 6b, and thereby the upstream side sensor 6a and the downstream side sensor 6b generate heat.

The flow rate calculation part 7 is specifically configured to include electrical circuits, and has: a control circuit that controls the upstream and downstream side sensors 6a and 6b to constantly make temperatures thereof equal to each other at a constant temperature; an amplifier circuit that amplifies an electrical signal outputted by the control circuit; and a correction circuit that corrects the electrical signal amplified by the amplifier circuit into the flow rate.

Note that, to prevent the heat of the thermal type flow rate sensor 6 from being transferred, the flow rate calculation part 7 is arranged separately from the thermal type flow rate sensor 6 in a way such as to be connected to the thermal type flow rate sensor 6 through a cable, or to be contained in a casing different from that for the thermal type flow rate sensor 6.

In the case where the source gas does not flow through the sensor pipe 3a branching from the pipe 3, values of the currents that respectively control the upstream and downstream side sensors 6a and 6b and flow from the control circuit are the same, and resistance values of the upstream and downstream side sensors 6a and 6b are the same, so that the temperatures of the upstream and downstream side sensors 6a and 6b are the same at the constant temperature.

Also, an electrical signal (voltage value) sensed by the upstream side sensor 6a and an electrical signal (voltage value) sensed by the downstream side sensor 6b are the same.

On the other hand, once the source gas flows through the sensor pipe 3a branching from the pipe 3, a heat quantity of the upstream side sensor 6a is taken by the source gas, and therefore the resistance value of the upstream side sensor 6a decreases. For this reason, the control circuit controlling the upstream side sensor 6a increases a value of the current flowing through the upstream side sensor 6a to keep constant the temperatures of the upstream and downstream side sensors 6a and 6b.

As a result, the electrical signal (voltage value) sensed by the upstream side sensor 6a and the electrical signal (voltage value) sensed by the downstream side sensor 6b become different from each other. The amplifier circuit amplifies the difference between the electrical signals. Then, the correction circuit uses the amplified difference and a split flow ratio between the source gas flowing through the sensor flow path and the source gas flowing through the bypass flow path 3b to calculate the flow rate of the source gas flowing through the pipe 3.

Structurally, the control part 4c is a so-called computer circuit having a CPU, an internal memory, an I/O buffer circuit, an A/D converter, and the like. Also, the control part 4c operates according to a program stored in a predetermined area of the internal memory, and consequently performs information processing to control the flow rate regulating part 4b.

Specifically, the control part 4c receives the flow rate of the source gas, which is detected by the flow rate detecting part 4a, compares the detected flow rate and a predetermined setting flow rate with each other, and transmits a control signal to the flow rate regulating part 4b so as to bring the detected flow rate close to the setting flow rate.

The flow rate regulating part 4b is, in the present embodiment, arranged upstream of the flow rate detecting part 4a, and provided with: a second block body 9 that is externally attached to the pipe 3; a regulating valve 10 that regulates the flow rate of the source gas flowing through the pipe 3; and a drive circuit 11 that converts the control signal transmitted from the control part 4c to a predetermined drive signal, and sends the drive signal to the regulating valve 10.

The second block body 9 is, as with the first block body 5, made of metal having a substantially rectangular parallelepiped shape and excellent thermal conductivity, and inside the second block body 9, a through-hole for passing the pipe 3 is provided.

An upstream side end part from which the pipe 3 is inserted into the second block body 9 serves as a connecting part 15 connected to the pipe 3.

The regulating valve 10 has: a valve main body 10a that is arranged so as to block the inside of the pipe 3 arranged inside the second block body 9; and drive means 10b that is adapted to mechanically drive the valve main body 10a. As the drive means 10b, a piezoelectric element such as a piezo actuator is used.

The drive circuit 11 converts the control signal transmitted from the control part 4c to the predetermined drive signal, and drives the drive means 10b with the drive signal. For example, in the case where a piezoelectric element is used as the drive means 10b, the control signal is converted into a predetermined voltage value (drive signal). The drive means 10b having received the drive signal from the drive circuit 11 varies an opening level of the valve main body 10a to regulate the flow rate of the source gas flowing through the pipe 3 arranged upstream of the flow rate detecting part 4a.

Note that the drive circuit 11 is arranged separately from the regulating valve 10 in a way such as to be connected to the regulating valve 10 through a cable or to be contained in a casing different from that for the regulating valve 10.

A heating vaporization method for the heating vaporization system 1 of the present embodiment configured as described above is described.

In the case of using the source gas produced by vaporizing the liquid source in the semiconductor process chamber or the like, a user introduces the liquid source from the introduction pipe 2c into the tank 2a, and heats the tank 2a with the heating device 2b. In doing so, temperature inside the tank 2a rises to make the liquid source reach the saturated vapor pressure and vaporize, and consequently the source gas is produced.

The source gas passes through the lead-out pipe 2d and flows through the pipe 3, and is then supplied to the semiconductor process chamber or the like. At this time, part of the source gas flowing through the pipe 3 flows through the sensor pipe 3a.

Once the source gas flows through the sensor pipe 3a, temperature of the upstream side sensor 6a provided in the sensor pipe 3a decreases, and to keep the upstream and downstream side sensors 6a and 6b at the same temperature, it is necessary to increase the electrical resistance value of the upstream side sensor 6a, which causes a difference in electrical resistance value between the upstream and downstream side sensors 6a and 6b. From an electrical signal (voltage value) based on the difference in electrical resistance value, the flow rate calculation part 7 uses the amplifier circuit and the correction circuit to calculate a flow rate. In doing so, the flow rate detecting part 4a detects the flow rate of the source gas flowing through the pipe 3, and sends the detected flow rate to the control part 4c.

Upon receipt of the detected flow rate, the control part 4c compares the detected flow rate and the predetermined setting flow rate with each other, and transmits a control signal to the flow rate regulating part 4b so as to bring the detected flow rate close to the setting flow rate.

The flow rate regulating part 4b converts the control signal transmitted from the control part 4c to a predetermined drive signal, drives the drive means 10b with the drive signal to open/close the valve main body 10a, and regulates the flow rate of the source gas flowing through the pipe 3 arranged upstream of the flow rate detecting part 4a.

Effects of First Embodiment

According to the heating vaporization system 1 of the first embodiment configured as described above, the flow rate detecting part 4a is provided on the downstream side of the flow rate regulating part 4b, and therefore in the case of preliminarily increasing temperature of the flow rate regulating part 4b in consideration of pressure loss, it is not necessary to make the temperature of the flow rate detecting part 4a equal to or more than the temperature of the flow rate regulating part 4b. For this reason, adverse effects such as the deterioration of the flow rate detecting part 4a and the deterioration of the source gas due to increasing the temperature of the flow rate detecting part 4a can be prevented, and also condensation inside the pipe 3 due to pressure loss caused by the flow rate regulating part 4b can be prevented to stably supply the source gas to the semiconductor process chamber or the like.

Second Embodiment

Next, a second embodiment of the heating vaporization system according to the present invention is described. A heating vaporization system 20 according to the second embodiment is different from the first embodiment in that a flow rate detecting part 4a and a flow rate regulating part 4b are respectively provided with heating means.

In addition, the same components as those in the first embodiment are denoted by the same reference letters or numerals, and description thereof is omitted.

Figure 2:
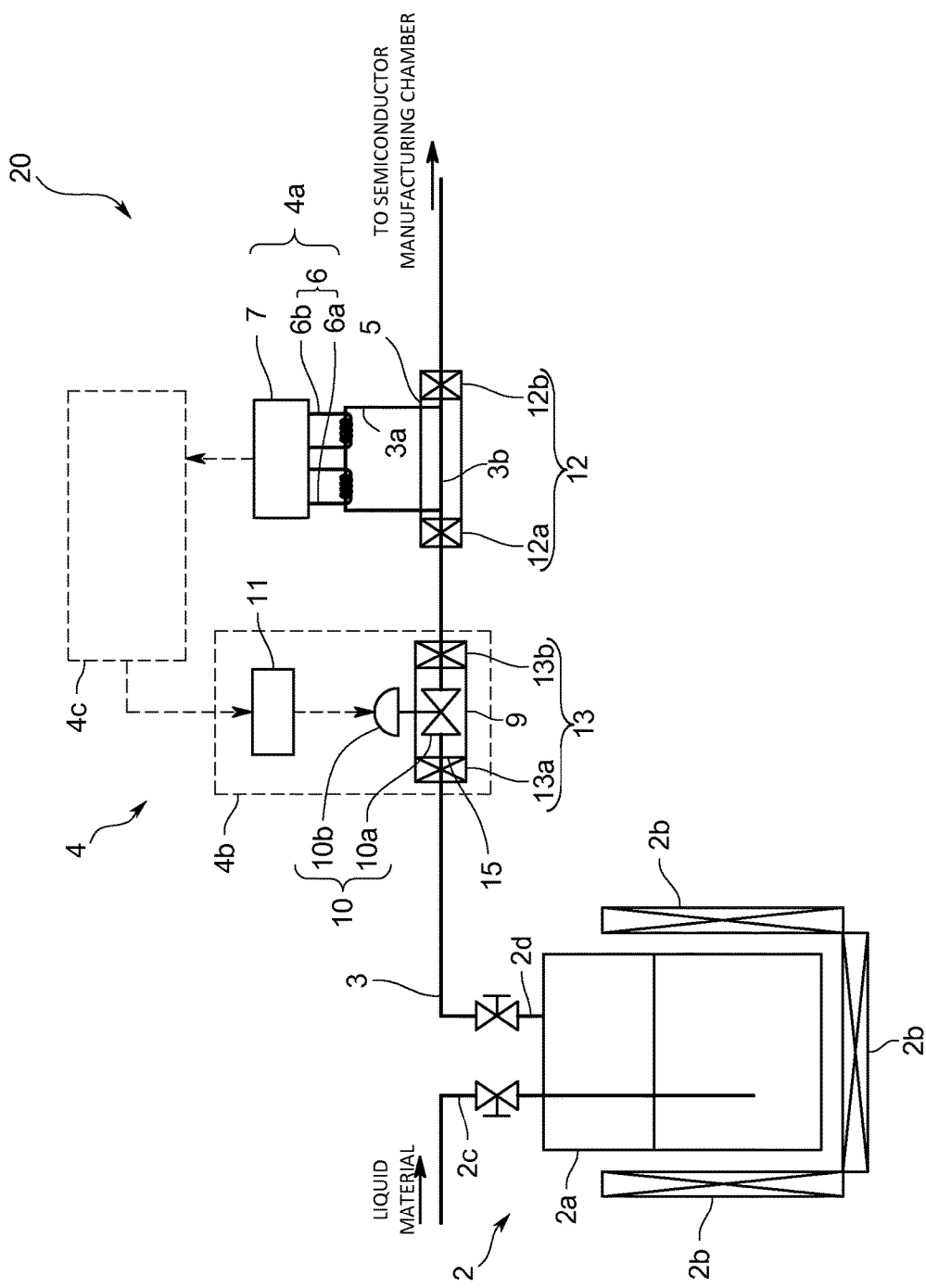
FIG. 2 is a schematic diagram illustrating a heating vaporization system in a second embodiment.

The heating vaporization system 20 according to the second embodiment is, as illustrated in FIG. 2, provided with first heating means 12 (12a and 12b) that are incorporated in the first block body 5 as well as being arranged around an outer circumferential surface of the pipe 3 located upstream and downstream of the sensor pipe 3a, and intended to heat source gas flowing through the pipe 3 penetrating through the first block body 5.

Further, the heating vaporization system 20 according to the second embodiment is provided with second heating means 13 (13a and 13b) that are incorporated in the second block body 9 as well as being arranged around an outer circumferential surface of the pipe 3 located upstream and downstream of the valve main body 10a, and intended to heat the source gas flowing through the pipe 3 penetrating through the second block body 9.

As the first heating means 12 or the second heating means 13, for example, heaters or the like are used. The first block body 5 and the second block body 9 are both made of metal having good thermal conductivity, and therefore heat from the heaters efficiently transfers to the pipe 3 to heat the source gas flowing through the pipe 3.

Effects of Second Embodiment

According to the heating vaporization system 20 of the second embodiment configured as described above, the flow rate detecting part 4a and the flow rate regulating part 4b are respectively provided with the first heating means 12 and the second heating means 13, so that to prevent condensation in anticipation of pressure loss, temperature of the flow rate regulating part 4b can be preliminarily increased, and temperature of the flow rate detecting part 4a can be kept at a temperature at which the source gas can be prevented from being liquefied again, as a result of which the occurrence of condensation inside the pipe 3 can be surely prevented.

Also, by heating the first block body 5 with the first heating means 12 to bring temperature of the source gas flowing through the pipe 3 penetrating through the first block body 5 close to the temperature of the sensor pipe 3a heated by a heating part 8, a detection error of the thermal type flow rate sensor 6, which is based on a temperature difference between the temperature of the sensor pipe 3a and the temperature of the source gas, can be prevented to increase detection accuracy of the flow rate detecting part 4a.

Third Embodiment

Next, a third embodiment of the heating vaporization system according to the present invention is described. A heating vaporization system 30 according to the third embodiment is different from the first embodiment in that, in addition to providing a flow rate detecting part 4a and a flow rate regulating part 4b with heating means, respectively, between the flow rate detecting part 4a and the flow rate regulating part 4b, internal heating means is further provided.

In addition, the same components as those in the first and second embodiments are denoted by the same reference letters or numerals, and description thereof is omitted.

Figure 3:
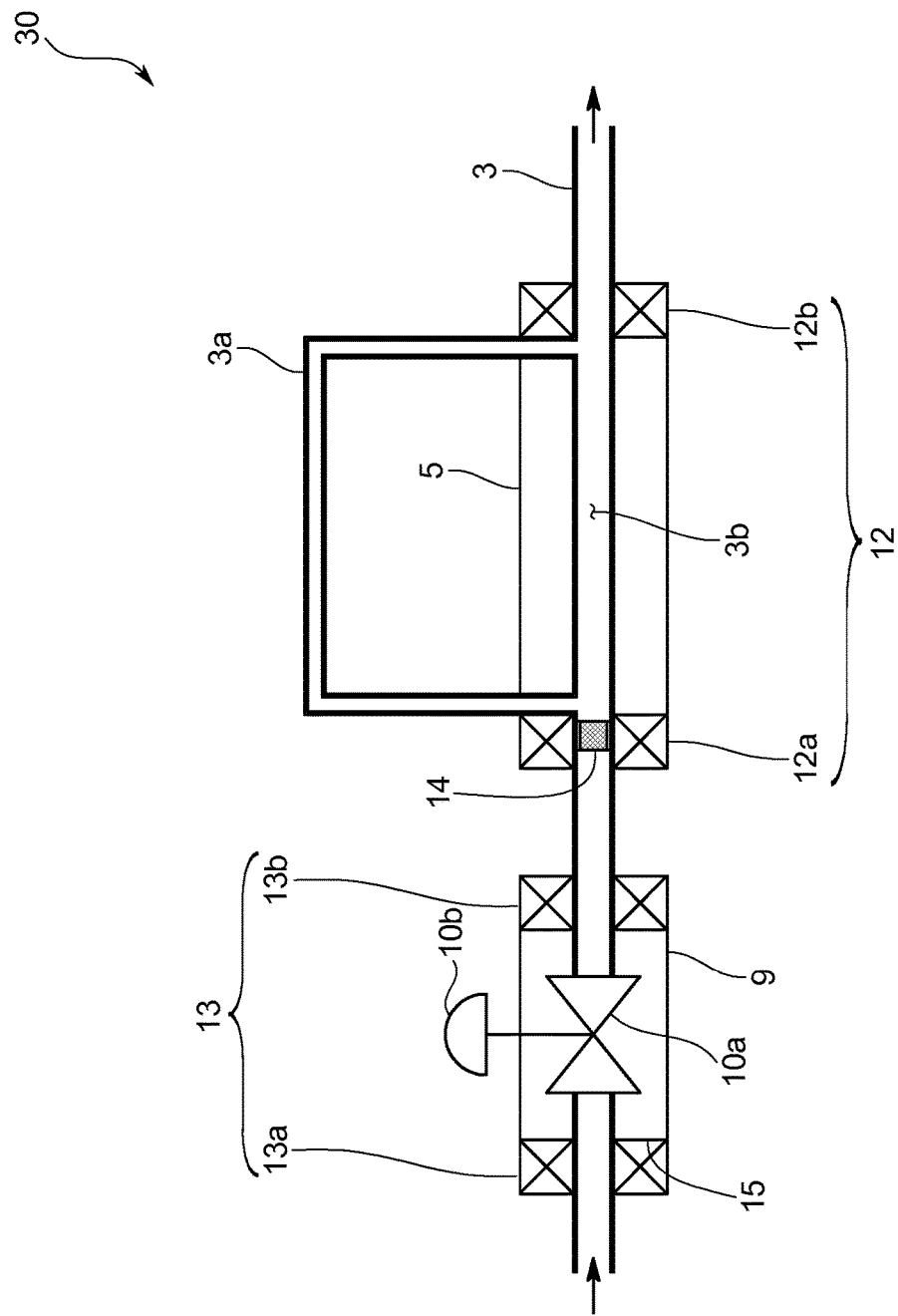
FIG. 3 is a schematic diagram illustrating a heating vaporization system in a third embodiment.

The heating vaporization system 30 according to the third embodiment is, as illustrated in FIG. 3, further provided with the internal heating means 14 that is provided inside the pipe 3 located downstream of the valve main body 10a and upstream of the flow rate detecting part 4a and intended to make uniform the temperature of the source gas flowing through the pipe 3.

Figure 4:
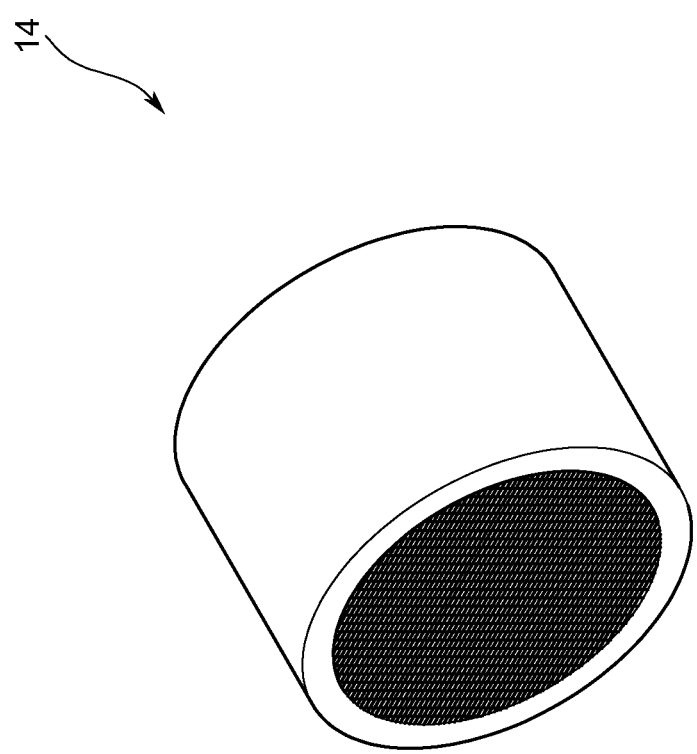
FIG. 4 is a reference perspective view illustrating internal heating means.

The internal heating means 14 is configured to include: a heating member that is arranged inside the pipe 3; and a heat supplying device (not illustrated) that supplies heat to the heating member, and the heating member is, as illustrated in FIG. 4, configured such that in a hollow metal cylinder of which an outer circumferential surface is configured to fit along an inner circumferential surfaced of the pipe 3, a plurality of thin metallic wires are arranged in a mesh pattern. When the heat supplying device supplies heat to the heating member arranged inside the pipe 3, the source gas passing through the heating member is uniformly heated by coming into contact with the metal cylinder and thin metallic wires.

Effects of Third Embodiment

According to the heating vaporization system 30 of the third embodiment configured as described above, the internal heating means 14 is provided inside the pipe 3, and therefore heat can be transferred to the source gas more efficiently than by the first and second heating means 12 and 13 provided outside the pipe 3. For this reason, the source gas passing through the internal heating means 14 is uniformly heated, and therefore a reduction in detection accuracy of the flow rate detecting part 4a due to uneven heating can be prevented.

Also, by forming the internal heating means 14 in a mesh pattern, the occurrence of pressure loss between upstream and downstream sides of the internal heating means 14 can be prevented.

Note that the present invention is not limited to any of the above-described embodiments.

In each of the above-described embodiments, the liquid source is used as a source; however, for example, the present invention may gasify a solid source.

In each of the above-described embodiments, in the flow rate control device, the flow rate regulating part and the flow rate detecting part are provided as separate bodies; however, the present invention may be configured to integrally provide the flow rate regulating part and the flow rate detecting part by, for example, with the same block body, covering the part of the pipe where the valve main body of the flow rate regulating part is arranged and the part of the pipe where the bypass pipe is provided.

Also, in each of the above-described embodiments, in the flow rate detecting part, the upstream side sensor and the downstream side sensor heat the sensor pipe; however, the present invention may be configured to separately arrange a heater or the like for heating the sensor pipe, and sense temperatures with a pair of sensors respectively arranged upstream and downstream of the heater. In this case, the flow rate calculation part calculates a flow rate from a difference between the temperatures sensed by the sensors.

In addition, in each of the above-described embodiments, as the sensor flow path, the sensor pipe is provided; however, without providing the sensor pipe, the present invention may heat the pipe as the sensor flow path to detect a flow rate of the source gas flowing through the pipe.

Further, in each of the above-described embodiments, in the flow rate regulating part, the drive means uses the piezoelectric element such as a piezo actuator; however, the present invention can use any device such as a solenoid actuator or a thermal actuator without particular limitation as long as the device physically drives the valve main body.

Regarding the first heating means and the second heating means, only one of them may be placed, or as in each of the above-described embodiments, both of them may be placed.

Also, the first heating means and the second heating means are not respectively incorporated in the first block body of the flow rate detecting part and the second block body of the flow rate regulating part as in some of the above-described embodiments, but may be ones that are externally attached to the flow rate detecting part and the flow rate regulating part, respectively.

Further, the first heating means and the second heating means may be respectively placed on upstream or downstream side of the flow rate detecting part and the flow rate regulating part.

The internal heating means may be provided in the pipe located upstream of the valve main body in the flow rate regulating part.

Finally, it should be appreciated that the present invention is not limited to any of the above-described embodiments, but can be various modified without departing from the scope thereof.

REFERENCE CHARACTER LIST

1: Heating vaporization system
2: Container
3: Pipe
4a: Flow rate detecting part
4b: Flow rate regulating part
4c: Control part
8: Heating part
10a: Valve main body
12, 13: Heating means
14: Internal heating means

The invention claimed is:

1. A heating vaporization system comprising:
a container that comprises a tank that contains a source and a heating device that heats and vaporizes the source in the tank to produce a source gas;
a pipe connected to the tank and arranged downstream of the tank through which the source gas from the tank flows;
a sensor flow path that branches from the pipe and meets the pipe again;
a flow rate detecting part that comprises a thermal type flow rate sensor provided in the sensor flow path and measures a flow rate of the source gas flowing through the pipe, the thermal type flow rate sensor comprising an upstream side sensor that is coiled around an upstream side of the sensor flow path and a downstream side sensor that is coiled around a downstream side of the sensor flow path;
a flow rate regulating part that is provided upstream of the flow rate detecting part and downstream of the container, to regulate the flow rate of the source gas flowing through the pipe;
a control part that uses a flow rate measurement taken by the flow rate detecting part to control the flow rate regulating part;
one or more heaters arranged in each of the flow rate detecting part and the flow rate regulating part; and
an internal heater arranged inside the pipe located on an upstream side or a downstream side of the flow rate regulating part and adapted to heat the source gas,
wherein
the heating device and the one or more heaters are configured to separately control temperatures of the tank, the flow rate detecting part, and the flow rate regulating part,
the one or more heaters are configured to control a temperature of the flow rate detecting part to be equal to or lower than a temperature of the flow rate regulating part,
and
the internal heater includes:
a hollow metal cylinder of which an outer circumferential surface is configured to fit along an inner circumferential surface of the pipe; and
a metal mesh heating element disposed within the hollow metal cylinder.

2. The heating vaporization system according to claim 1, wherein the internal heater is arranged inside the pipe and is located between the downstream side of the flow rate regulating part and an upstream side of the flow rate detecting part.

3. A heating vaporization method, comprising:
heating and vaporizing a liquid source contained inside a container to produce a source gas, and leading the source gas out into a pipe connected to the container;
providing a sensor flow path that branches from the pipe and meets the pipe again, and measuring via a flow rate detecting part a flow rate of the source gas flowing through the pipe with use of a thermal flow rate sensor provided in the sensor flow path, the thermal type flow rate sensor comprising an upstream side sensor that is coiled around an upstream side of the sensor flow path and a downstream side sensor that is coiled around a downstream side of the sensor flow path;
regulating the flow rate of the source gas via a flow rate regulating part provided upstream of the flow rate detecting part and downstream of the container, based upon a flow rate measurement taken by the flow rate detecting part;
heating each of the flow rate detecting part and the flow rate regulating part;
heating the source gas with an internal heater arranged inside the pipe located between the flow rate regulating part and the flow rate detecting part, wherein the internal heater includes a hollow metal cylinder of which an outer circumferential surface is configured to fit along an inner circumferential surface of the pipe and a metal mesh heating element disposed within the hollow metal cylinder;

separately controlling temperatures of the container, the flow rate detecting part, and the flow rate regulating part; and controlling a temperature of the flow rate detecting part to be equal to or lower than a temperature of the flow rate regulating part.

4. The heating vaporization system according to claim 1, wherein the heating device is configured to control the temperature of a liquid source in the tank so as to reach saturated vapor pressure.

5. The heating vaporization system according to claim 1, wherein a heater arranged in the flow rate regulating part is configured to control the temperature of the flow rate regulating part so as to prevent the source gas from being liquefied in the flow rate regulating part.

6. The heating vaporization system according to claim 5, wherein the temperature of the flow rate regulating part is set based on a pressure loss in the flow rate regulating part.

7. The heating vaporization system according to claim 5, wherein the flow rate regulating part causes a temperature of the source gas in the pipe to approximate a temperature of the sensor flow path.

8. The heating vaporization system according to claim 1, wherein a heater arranged in the flow rate detecting part is configured to control the temperature of the flow rate detecting part so as to prevent the source gas from being liquefied in the flow rate detecting part.

* * * * *